United States Patent
Charais et al.

(10) Patent No.: US 12,512,850 B2
(45) Date of Patent: Dec. 30, 2025

(54) MICROCONTROLLER INCLUDING A DIGITAL POTENTIOMETER

(71) Applicant: Microchip Technology Incorporated, Chandler, AZ (US)

(72) Inventors: John Charais, Oconomowoc, WI (US); Stein Julusmoen, Trondheim (NO)

(73) Assignee: Microchip Technology Incorporated, Chandler, AZ (US)

( * ) Notice: Subject to any disclaimer, the term of this patent is extended or adjusted under 35 U.S.C. 154(b) by 95 days.

(21) Appl. No.: 18/668,807

(22) Filed: May 20, 2024

(65) Prior Publication Data

US 2025/0286562 A1 Sep. 11, 2025

Related U.S. Application Data

(60) Provisional application No. 63/561,473, filed on Mar. 5, 2024.

(51) Int. Cl.
*H03M 1/80* (2006.01)
*H03M 1/76* (2006.01)
(Continued)

(52) U.S. Cl.
CPC .......... *H03M 1/808* (2013.01); *H03M 1/765* (2013.01); *H03M 1/785* (2013.01); *G06F 1/00* (2013.01); *H03M 1/76* (2013.01); *H03M 1/80* (2013.01)

(58) Field of Classification Search
CPC ........ H03M 1/80; H03M 1/808; H03M 1/765; H03M 1/785; G06F 1/00
See application file for complete search history.

(56) References Cited

U.S. PATENT DOCUMENTS

| 5,731,736 A | 3/1998 | Ezell | 327/536 |
| 5,831,566 A | 11/1998 | Ginetti | 341/144 |

(Continued)

OTHER PUBLICATIONS

Microchip Technology Incorporated, "MCP4021/2/3/4: Low-Cost NV Digital POT with WiperLock Technology," URL: https://ww1.microchip.com/downloads/aemDocuments/documents/APID/ProductDocuments/DataSheets/MCP4021-2-3-4-Low-Cost-NV-Digital-POT-with-WiperLock-Technology-DS20001945.pdf, 74 pages.

(Continued)

*Primary Examiner* — Joseph J Lauture
(74) *Attorney, Agent, or Firm* — SLAYDEN GRUBERT BEARD PLLC (57) ABSTRACT

An apparatus comprises a microcontroller including a digital potentiometer provided in a microcontroller packaging. The digital potentiometer includes a resistor ladder including a plurality of resistors arranged in series and a plurality of selectively controllable potentiometer switches, a first resistor terminal connected to the resistor ladder, and a wiper terminal connected to the resistor ladder. The microcontroller includes a processor to transmit a wiper select signal to the digital potentiometer to selectively control the potentiometer switches to selectively connect at least a subset of the resistors between the first resistor terminal and wiper terminal, to thereby control the resistance between the first resistor terminal and wiper terminal. The microcontroller includes a first pin connected to the first resistor terminal and a second pin connected to the wiper terminal, the first and second pins being exposed through the microcontroller packaging to allow connection of the digital potentiometer to an external device.

20 Claims, 3 Drawing Sheets

(51) Int. Cl.
*H03M 1/78* (2006.01)
*G06F 1/00* (2006.01)

(56) References Cited

U.S. PATENT DOCUMENTS

| | | |
|---|---|---|
| 7,391,354 B2 | 6/2008 | Tsunakawa et al. .......... 341/172 |
| 2019/0072592 A1* | 3/2019 | Cianfrocco ........... H02J 7/0071 |

OTHER PUBLICATIONS

Iacob, Radu H. et al., "Multistage Architectures for High Resolution Digital Potentiometers," ISSCS International Symposium on Signals, Circuits, and Systems, 4 pages.

Texas Instruments Incorporated, "Replacing Digital Potentiometers with Precision DACs," URL: https://www.ti.com/lit/ab/slaa906/slaa906.pdf?ts=1734620755601&ref_url=https%253A%252F%252Fwww.google.com%252F, 4 pages.

International Search Report and Written Opinion, Application No. PCT/US2024/045274, 14 pages.

* cited by examiner

MICROCONTROLLER INCLUDING A DIGITAL POTENTIOMETER

RELATED APPLICATION

This application claims priority to commonly owned U.S. Provisional Patent Application No. 63/561,473 filed Mar. 5, 2024, the entire contents of which are hereby incorporated by reference for all purposes.

TECHNICAL FIELD

The present disclosure relates to digital potentiometers (DigiPots), and more particularly to a microcontroller including an integrated DigiPot.

BACKGROUND

A digital potentiometer or "DigiPot" is a digitally controlled device to produce a desired impedance (e.g., to adjust a voltage or current) to thereby provide a similar function as a mechanical potentiometer, a rheostat, or other device. DigiPots typically have an architecture including a "resistor ladder" or a digital-to-analog converter (DAC).

A resistor ladder type DigiPot includes (a) a plurality of resistors connected in series, called a "resistor ladder," connected between a pair of resistor ladder terminals (often referred to as Terminals A and B) and (b) a wiper terminal (often referred to as Terminal W) that is selectively connected to a respective "step" along the resistor ladder using digital signals to control switches connected at different points along the resistor ladder. Such control signals are typically communicated over Serial Peripheral Interface (SPI) or Inter-Integrated-Circuit (I²C) interfaces.

The selected step on the resistor ladder determines the resistance ratio of the DigiPot. The number of steps is normally indicated with a bit value, for example where 8 bits provides 256 steps. Some example applications of DigiPots include sensor calibration, volume control, brightness control, and programmable filters.

Unlike a typical DAC, which uses a resistor ladder to produce a selected voltage and typically does not carry a current (or carries a very small current of less than 10 µA), a typical DigiPot is designed to carry a current (e.g., 1-10 mA) and uses a resistor ladder to controllably limit the current, by producing a selected impedance.

A DigiPot may provide different functionality depending on the connection of the resistor ladder terminals (e.g., Terminals A and B). For example, a DigiPot having the resistor ladder terminals (e.g., Terminals A and B) connected to an electric circuit may function as a potentiometer. As another example, a DigiPot having one resistor ladder terminal connected to an electric circuit with the other resistor ladder terminal (e.g., Terminal B) floating may function as a rheostat. As another example, a DigiPot having one resistor ladder terminal (e.g., Terminal A) floating with the other resistor ladder terminal (e.g., Terminal B) connected to ground may function as a "grounded resistor" device. Accordingly, as used herein, a "digital potentiometer" or "DigiPot" may comprise a potentiometer, a rheostat, or a grounded resistor device, depending on the connection of the resistor ladder terminals.

Embedded microcontrollers commonly work with external stand-alone DigiPots, for example in the form of discrete potentiometer, rheostat, or grounded resistor packages. A stand-alone DigiPot package includes various pins connected to respective pins of an embedded microcontrollers (e.g., by wire bonds or solder bonds), to provide a supply voltage and control signals to the stand-alone DigiPot.

There is a need to provide a microcontroller with an integrated DigiPot.

SUMMARY

Examples of the present disclosure provide a microcontroller (e.g., an embedded microcontroller) including a digital potentiometer (DigiPot) formed therein, referred to herein as an integrated DigiPot. The integrated DigiPot may comprise a potentiometer, a rheostat, or a grounded resistor device.

One aspect provides an apparatus comprising a microcontroller, the microcontroller comprising a microcontroller packaging and a digital potentiometer (DigiPot), a microcontroller memory, and a processor arranged in the microcontroller packaging. The DigiPot includes a resistor ladder including a plurality of resistors arranged in series and a plurality of potentiometer switches, a first resistor terminal connected to the resistor ladder, and a wiper terminal connected to the resistor ladder, wherein the plurality of potentiometer switches are selectively controllable to selectively connect at least a subset of the plurality of resistors between the first resistor terminal and the wiper terminal to define a resistance between the first resistor terminal and the wiper terminal. The microcontroller memory stores a wiper select signal. The processor to transmit the wiper select signal to the digital potentiometer to selectively control the plurality of switches to control the resistance between the first resistor terminal and the wiper terminal. The microcontroller includes a first pin connected or connectable to the first resistor terminal, and a second pin connected or connectable to the wiper terminal, wherein the first pin and the second pin are exposed through the microcontroller packaging to allow connection of the digital potentiometer to an electronic device external to the microcontroller.

In some examples, the microcontroller includes a charge pump to apply a charge pump voltage to the potentiometer switches. In some examples, the microcontroller includes switching circuitry to selectively switch between (a) a first switch state in which the supply voltage is applied to the potentiometer switches; and (b) a second switch state in which the charge pump voltage is applied to the potentiometer switches to maintain a constant impedance of the potentiometer switches, independent of variations in the supply voltage.

In some examples, the microcontroller includes a first pin switch connected between the first pin and the first resistor terminal, and a second pin switch connected between the second pin and the wiper terminal, and wherein the first pin switch and the second pin switch are controllable by the processor using respective pin switch control signals.

In some examples, the first pin switch is controllable to selectively connect the first pin to different selected circuitry, including at least (a) the first resistor terminal of the digital potentiometer and (b) a first other circuit component of the microcontroller; and the second pin switch is controllable to selectively connect the first pin to different selected circuitry, including at least (a) the second resistor terminal of the digital potentiometer and (b) a second other circuit component of the microcontroller.

In some examples, the microcontroller includes a charge pump to apply a constant charge pump voltage to the first pin switch and the second pin switch.

In some examples, the microcontroller include switching circuitry to selectively switch, based on a charge pump select signal, between (a) a first switch state in which a supply voltage is applied to the first pin switch and the second pin switch and (b) a second switch state in which the constant charge pump voltage is applied to the first pin switch and the second pin switch.

In some examples, the digital potentiometer comprises a potentiometer. In other examples, the digital potentiometer comprises a rheostat. In other examples, the digital potentiometer comprises a grounded resistor.

In some examples, the digital potentiometer comprises a second resistor terminal connected to the resistor ladder, wherein the plurality of potentiometer of resistors are connected between the first resistor terminal and the second resistor terminal; and the microcontroller comprises a third pin connected to the second resistor terminal, wherein the third pin is exposed through the microcontroller packaging.

In some examples, the microcontroller includes a first pin switch connected between the first pin and the first resistor terminal, and a second pin switch connected between the second pin and the wiper terminal, and a third pin switch connected between the third pin and the second resistor terminal, wherein the first pin switch, the second pin switch, and the third pin switch are controllable by the processor using respective pin switch control signals.

One aspect provides an apparatus including an electronic device including electronic device circuitry, and a microcontroller connected to the electronic device. The microcontroller includes a microcontroller packaging, and a digital potentiometer arranged in the microcontroller packaging and including a resistor ladder including a plurality of resistors arranged in series, and a plurality of selectively controllable potentiometer switches, a first resistor terminal connected to the resistor ladder, and a wiper terminal connected to the resistor ladder. The microcontroller also includes a first pin connected to the first resistor terminal. And a second pin connected to the wiper terminal, wherein the first pin and the second pin are exposed through the microcontroller packaging and connectable to the electronic device. The microcontroller also includes a microcontroller memory arranged in the microcontroller packaging, the microcontroller memory storing a wiper select signal, and a processor arranged in the microcontroller packaging, the processor to transmit the wiper select signal to the digital potentiometer to selectively control the plurality of potentiometer switches to control the resistance between the first resistor terminal and the wiper terminal, and thereby selectively control a resistance through the electronic device circuitry of the electronic device.

In some examples of the apparatus, the microcontroller comprises a charge pump to apply a charge pump voltage to the potentiometer switches.

In some examples of the apparatus, the microcontroller comprises switching circuitry to selectively switch, based on a charge pump select signal, between (a) a first switch state in which the supply voltage is applied to the potentiometer switches; and (b) a second switch state in which the charge pump voltage is applied to the potentiometer switches to maintain a constant impedance of the potentiometer switches, independent of variations in the supply voltage.

In some examples, the microcontroller comprises a first pin switch connected between the first pin and the first resistor terminal, and a second pin switch connected between the second pin and the wiper terminal, wherein the first pin switch and the second pin switch are controllable by the processor using respective pin switch control signals.

In some examples, the first pin switch is controllable to selectively connect the first pin to either (a) the first resistor terminal of the digital potentiometer or (b) a first other circuit component of the microcontroller, and the second pin switch is controllable to selectively connect the second pin to either (a) the second resistor terminal of the digital potentiometer or (b) a second other circuit component of the microcontroller.

In some examples of the apparatus, the microcontroller comprises a charge pump to apply a constant charge pump voltage to the first pin switch and the second pin switch.

In some examples, the microcontroller comprises switching circuitry to selectively switch, based on a charge pump select signal, between (a) a first switch state in which a supply voltage is applied to the first pin switch and the second pin switch and (b) a second switch state in which the constant charge pump voltage is applied to the first pin switch and the second pin switch.

One aspect provides an apparatus comprising a microcontroller, the microcontroller comprising a microcontroller packaging and a digital potentiometer (DigiPot) arranged in the microcontroller packaging. The DigiPot includes a resistor ladder including a plurality of resistors arranged in series and a plurality of potentiometer switches, a first resistor terminal connected to the resistor ladder, and a wiper terminal connected to the resistor ladder, wherein the plurality of potentiometer switches are selectively controllable to selectively connect at least a subset of the plurality of resistors between the first resistor terminal and the wiper terminal to define a resistance between the first resistor terminal and the wiper terminal. The microcontroller includes a charge pump to apply a charge pump voltage to respective potentiometer switches of the plurality of potentiometer switches.

In some examples, the microcontroller comprises switching circuitry to selectively switch between (a) a first switch state in which the supply voltage is applied to the potentiometer switches and (b) a second switch state in which the charge pump voltage is applied to the potentiometer switches.

BRIEF DESCRIPTION OF THE DRAWINGS

Example aspects of the present disclosure are described below in conjunction with the figures, in which.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Examples of the present disclosure provide a microcontroller (e.g., an embedded microcontroller) including a digital potentiometer (DigiPot) formed therein, referred to herein as an integrated DigiPot. The integrated DigiPot may be arranged as a potentiometer, a rheostat, or a grounded resistor device, e.g., depending on the respective implementation. The integrated DigiPot may provide various benefits. For example, the integrated DigiPot may reduce system cost, e.g., as compared with a stand-alone DigiPot connected to a microcontroller. For example, the microcontroller may include various components used by the DigiPot, for example non-volatile memory (NVM), thus allowing for a reduction in system components. As another example, the serial interface and control program included in a stand-alone DigiPot may be eliminated, as the DigiPot can be programmed by a processor (e.g., core) of the microcontroller, which may improve the speed or latency of control of the DigiPot. In addition, the additional package of the conventional stand-alone DigiPot may be eliminated. As another example, in some examples the integrated DigiPot may allow reduced test time and reduced test flows, e.g., as compared with a stand-alone DigiPot connected to a microcontroller.

Figure 1:
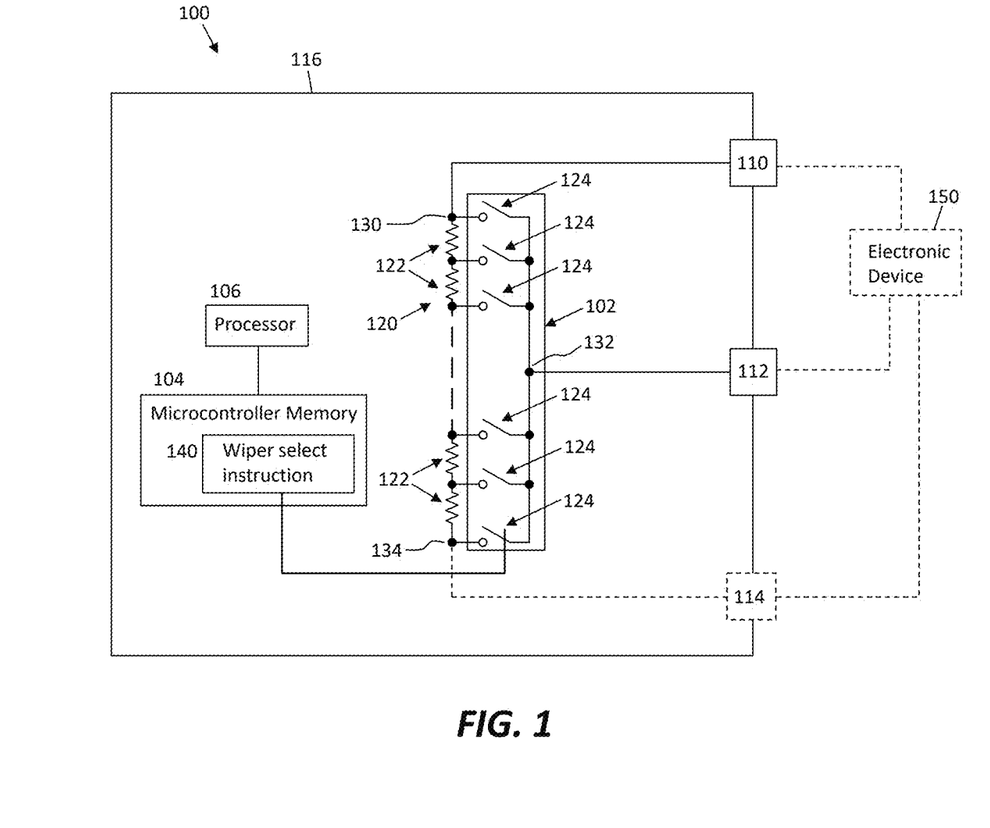
FIG. 1 shows an example microcontroller including an integrated digital potentiometer (DigiPot)

FIG. 1 shows an example microcontroller 100 (e.g., an embedded microcontroller) including an example digital potentiometer (DigiPot) 102 integrated therein. The DigiPot 102 and various other components, including a microcontroller memory 104, a processor 106, a first pin 110, a second pin 112, and optionally a third pin 114 are provided in a microcontroller packaging 116, e.g., comprising an epoxy mold compound (EMC) or other encapsulant.

The DigiPot 102 may include a resistor ladder 120 including a plurality of resistors 122 arranged in series, a plurality of potentiometer switches 124, and a number of resistor terminals connected to the resistor ladder 120, including a first resistor terminal 130, a wiper terminal 132, and optionally a second resistor terminal 134. The plurality of potentiometer switches 124 are selectively controllable to selectively connect at least a subset of the resistors 122 (i.e., a subset or all of the resistors 122) between the first resistor terminal 130 and the wiper terminal 132 to define a resistance between the first resistor terminal 130 and the wiper terminal 132. In some examples, the potentiometer switches 124 may be selectively controllable to bypass the resistor ladder 120; in such examples the "at least a subset of the resistors 122" selectively connected between the first resistor terminal 130 and the wiper terminal 132 may include none, some, or all of the resistors 122, depending on the relevant control of the respective potentiometer switches 124.

In contrast, the full plurality (series) of resistors 122 remains connected between the first resistor terminal 130 and the optional second resistor terminal 134.

In some examples, the first resistor terminal 130 may be connected at one end (e.g., a "top" end) the resistor ladder 120, and the optional second resistor terminal 134 may be connected at an opposite end (e.g., a "bottom" end) the resistor ladder 120. In some examples, the first resistor terminal 130 may be referred to as "Terminal A," the optional second resistor terminal 134 may be referred to as "Terminal B," and the wiper terminal 132 may be referred to as "Terminal W."

The microcontroller memory 104 may include any one or more data storage device, for example processor registers (e.g., digital control registers), an Electrically Erasable Programmable Read-Only Memory (EEPROM) device, and/or other non-volatile memory (NVM) device. The microcontroller memory 104 may store at least one wiper select signal 140 for selectively controlling the potentiometer switches 124 to control the resistance between the first resistor terminal 130 and the wiper terminal 132.

The processor 106 may comprise a Central Processing Unit (CPU) including one or more processor cores, a Digital Signal Processors (DSP), Application-Specific Integrated Circuit (ASIC), and/or other type(s) or processor. The processor 106 may transmit the wiper select signal(s) 140 to the digital potentiometer 102 to selectively control respective ones of the potentiometer switches 124 to connect a selected subset of resistors 122 between the first resistor terminal 130 and wiper terminal 132, to thereby control a resistance between the first resistor terminal 130 and wiper terminal 132. In one example, the processor 106 may transmit the wiper select signal(s) 140 to the digital potentiometer 102 by writing to a register (not shown) of the digital potentiometer 102 via an internal data bus of microcontroller 100.

The first resistor terminal 130 is connected or connectable to the first pin 110, the wiper terminal 130 is connected or connectable to the second pin 112, and the optional second resistor terminal 134 is connected or connectable to the optional third pin 114. The first pin 110, second pin 112, and optional third pin 114 may be exposed through the microcontroller packaging 116 to allow connection of the DigiPot 102 to an external electronic device 150 (i.e., separate from the microcontroller 100) via the first pin 110, second pin 112, and/or optional third pin 114.

The term pin, as used herein, for example in the context of the first pin 110, second pin 112, and optional third pin 114, includes any type of conductive contact, for example gull-wing or J-lead terminals, solder balls, or lands, without limitation.

Figure 3:
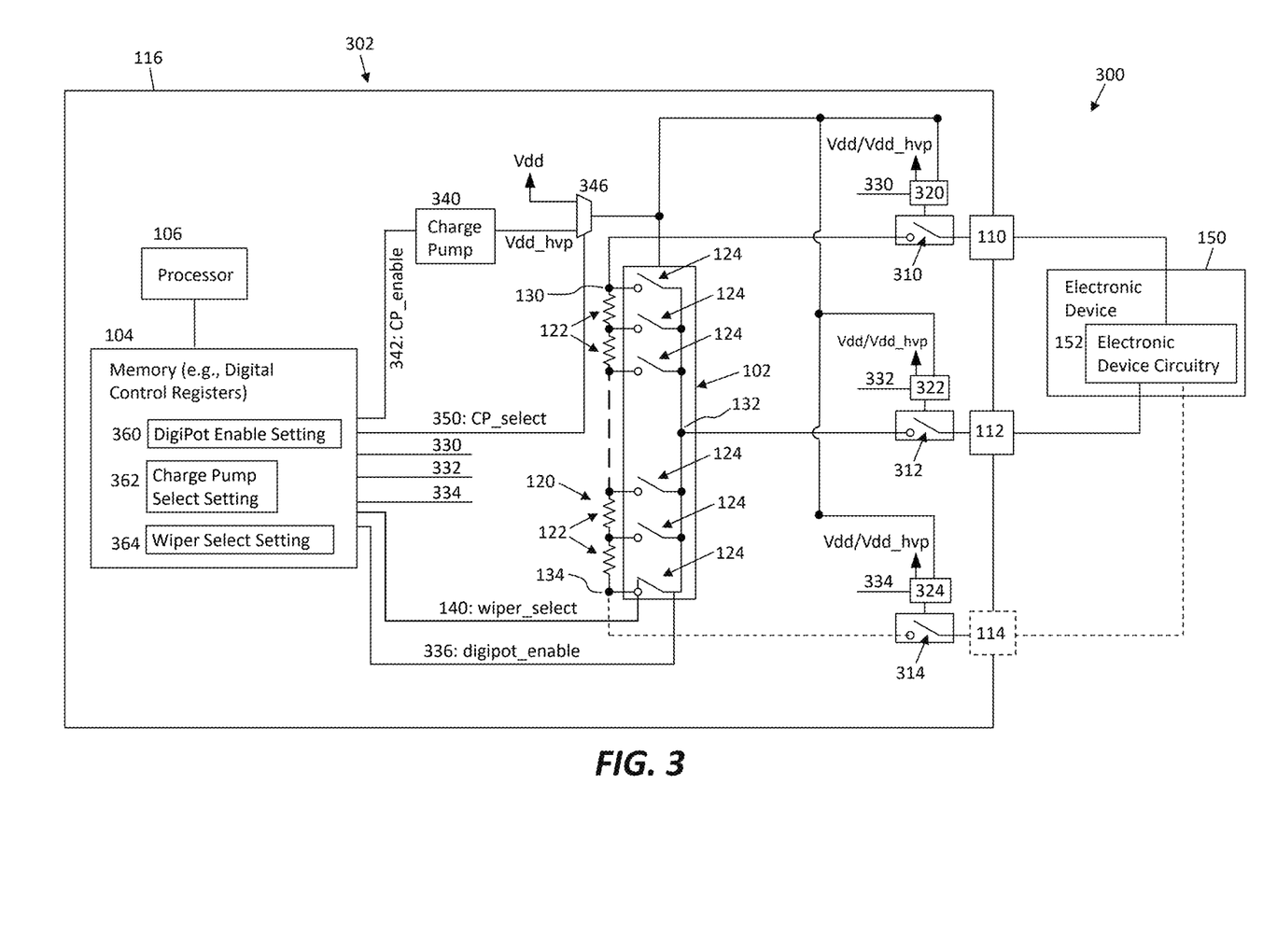
FIG. 3 shows another example apparatus including another example microcontroller including an integrated DigiPot, and an example electronic device connected to the integrated DigiPot.

In some examples, e.g., as shown in FIG. 3 discussed below, the first resistor terminal 130 is selectively connectable to the first pin 110 by controlling a first pin switch, the wiper terminal 132 is selectively connectable to the second pin 112 by controlling a second pin switch, and the optional second resistor terminal 134 is selectively connectable to the optional third pin 114 by controlling a third pin switch. As discussed below, these controllable pin switches may allow an external device (e.g., the example electronic device 150) to selective connect to either the DigiPot 102 or other electronics in the microcontroller 100 via the first pin 110, second pin 112, and/or optional third pin 114. In another example, the first resistor terminal 130 and wiper terminal 132 may be permanently connected to the first pin 110, second pin 112, and/or optional third pin 114, respectively.

The potentiometer switches 124 carry current (e.g., in the range of milliamps) during operation, and thus inherently have an impedance, referred to herein as switch impedance, which is exponentially proportional to voltage. In some examples, the microcontroller supply voltage (Vdd) may vary over time. These variations in the supply voltage (Vdd), if applied to the DigiPot, may affect the switch impedance of potentiometer switches 124, which in some instances may significantly affect the performance of the DigiPot 102, e.g., by reducing the predictability and reliability of the DigiPot 102 output. Thus, in some examples, the example microcontroller 100 may optionally include a charge pump (not shown in FIG. 1) to apply a constant charge pump voltage (Vdd_hvp) to the DigiPot 102 (rather than the supply voltage Vdd), which may function to maintain a constant switch impedance of potentiometer switches 124, independent of variations in the microcontroller supply voltage Vdd. The microcontroller 100 may include switching circuitry (e.g., a multiplexer) to selectively switch, based on a charge pump select signal effected by the processor 106, between (a) a first switch state in which the supply voltage Vdd is applied to DigiPot 102 and (b) a second switch state in which the constant charge pump voltage Vdd_hvp is applied to DigiPot 102. Example features of such charge pump and switching circuitry are discussed below with reference to FIG. 3.

As used herein, the term "constant" means varying by less than +10%, or in some implementations less than +5%, over time. For example, a constant charge pump voltage (Vdd_hvp) as discussed herein refers to a charge pump voltage that varies by less than +10%, or in some implementations less than +5%, over time. Similarly, a constant switch impedance as discussed herein refers to an impedance of a switch (e.g., a potentiometer switch or a pin switch discussed herein) that varies by less than +10%, or in some implementations less than +5%, over time.

Figure 2:
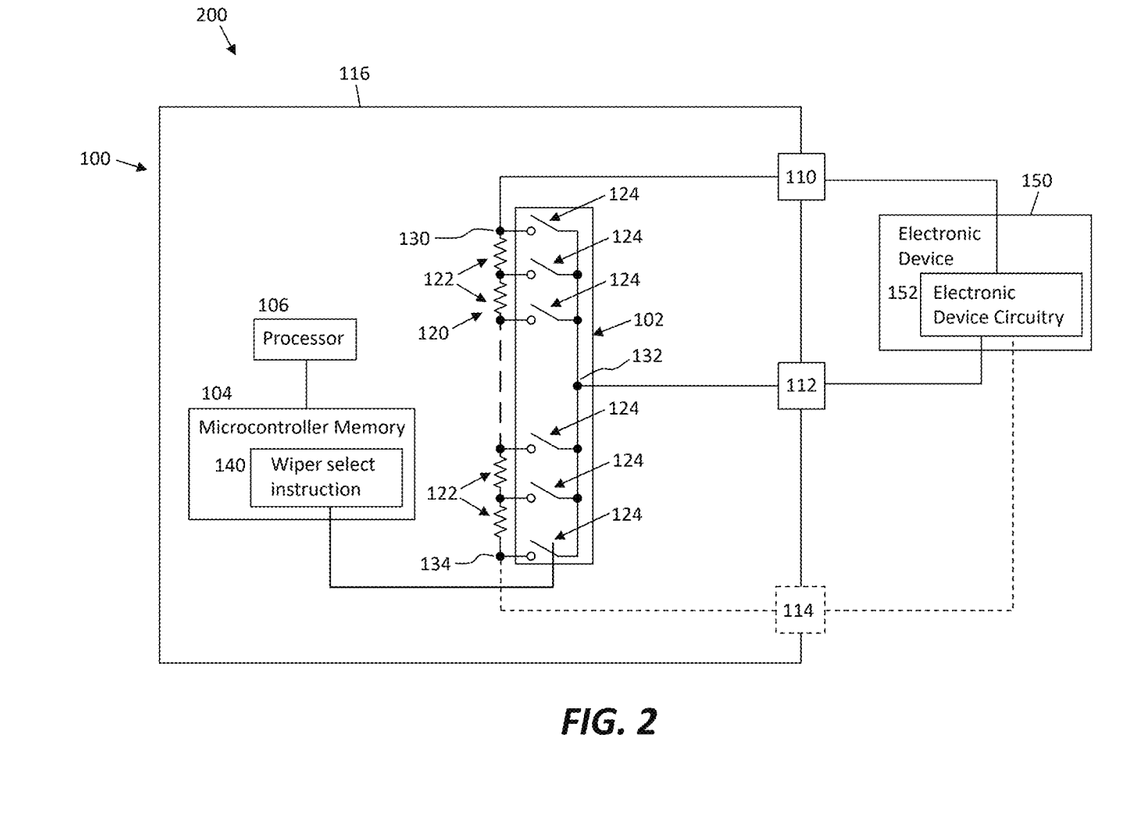
FIG. 2 shows an example apparatus including the example microcontroller of FIG. 1 including the integrated DigiPot, and an example electronic device connected to the integrated DigiPot.

FIG. 2 shows an example apparatus 200 including the example microcontroller 100 including the integrated DigiPot 102 as discussed above, and an example electronic device 150 connected to the integrated DigiPot 102. The electronic device 150 may include electronic device circuitry 152. The electronic device 150 may comprise, for example, a speaker, a passive filter, an active filter, or any other suitable type of electronic device.

As shown, the electronic device circuitry 152 is connected to the first pin 110 and second pin 112 of the microcontroller 100. The electronic device circuitry 152 may also be optionally connected to the optional third pin 114. The microcontroller processor 106 may use wiper select settings 364 stored in the microcontroller memory 104 to send wiper select signal(s) 140 to the integrated DigiPot 102 to selectively control respective potentiometer switches 124 to control the resistance between the first resistor terminal 130 and wiper terminal 132, and thereby selectively control a resistance through the electronic device circuitry 152. As discussed above, the microcontroller 100 may include a charge pump to apply a constant charge pump voltage Vdd_hvp is applied to DigiPot 102, to prevent or reduce variations in switch impedance of potentiometer switches 124 that may otherwise result from variations in the microcontroller supply voltage Vdd.

FIG. 3 shows an example apparatus 300 including an example microcontroller 302 including the integrated DigiPot 102, and an example electronic device 150 connected to the integrated DigiPot 102. The electronic device 150 may include electronic device circuitry 152. The example microcontroller 302 may represent an example implementation of the example microcontroller 102 that includes various additional features related to the integrated DigiPot 102, for example including (a) pin switches to selectively connect or disconnect the pins 110, 112, and 114 to the DigiPot 102 and (b) a charge pump to apply a constant voltage to the pin switches and the potentiometer switches 124 of the DigiPot 102 to maintain a respective switch impedance of the pin switches and potentiometer switches 124 constant, e.g., independent of variations in a supply voltage (Vdd), which may provide predictable performance of the DigiPot 102. It should be understood that any or all of the features of example microcontroller 302 discussed below may be similarly included in the example microcontroller 102 discussed above.

As shown in FIG. 3, the microcontroller 302 includes the elements of the example microcontroller 100 discussed above, including the DigiPot 102, microcontroller memory 104, processor 106, first pin 110, second pin 112, and optional third pin 114, provided in the microcontroller packaging 116, e.g., comprising EMC or other encapsulant. The DigiPot 102 includes the resistor ladder 120 including the plurality of resistors 122 arranged in series, the plurality of potentiometer switches 124, the first resistor terminal 130, wiper terminal 132, and optional second resistor terminal 134.

The microcontroller 302 also includes a first pin switch 310 connected between the first pin 110 and the first resistor terminal 130, a second pin switch 312 connected between the second pin 112 and the wiper terminal 132, and a third pin switch 314 connected between the third pin 114 and the second resistor terminal 134. The first pin switch 310, second pin switch 312, and third pin switch 314 are controllable by the processor 106 using respective pin switch control signals. As shown, the first pin switch 310, second pin switch 312, and third pin switch 314 are connected to respective level shifters (LS) that can control the first pin switch 310, second pin switch 312, and third pin switch 314 based on respective pin switch control signals. In particular, a first level shifter 320 connected to the first pin switch 310 may control the first pin switch 310 based on a first pin switch control signal 330 to selectively connect (or disconnect) the first pin 110 to the DigiPot 102; a second level shifter 322 connected to the second pin switch 312 may control the second pin switch 312 based on a second pin switch control signal 332 to selectively connect (or disconnect) the second pin 112 to the DigiPot 102; and a third level shifter 324 connected to the third pin switch 314 may control the third pin switch 314 based on a third pin switch control signal 334 to selectively connect (or disconnect) the third pin 114 to the DigiPot 102.

The processor 106 may generate the pin switch control signals 330, 332, and 334, along with a DigiPot enable signal 336 to enable/disable the DigiPot 102, based on DigiPot enable settings 360 stored in the microcontroller memory 104.

In some examples, the first pin switch 310, second pin switch 312, and third pin switch 314 are provided in an input selector multiplexer (MUX) for selectively (alternatively) connecting the first pin 110, second pin 112, and third pin 114 to multiple different functional circuits, including the DigiPot 102 and other functional circuits, thereby allowing the external electronic device 150 to selectively connect to the DigiPot 102 or to other functional circuitry of the microcontroller 302 using the same pins 110, 112, and 114, e.g., depending on different needs or functioning of the electronic device 150 at different times.

The pin switches 310, 312, and 314 and potentiometer switches 124 in the DigiPot 102 carry current (e.g., in the range of milliamps) during operation, and thus inherently have an impedance, referred to herein as switch impedance. The switch impedance of a respective switches (e.g., pin switches 310, 312, and 314 and potentiometer switch 124) is exponentially proportional to voltage. In one example, the switch impedance of a respective potentiometer switch 124 is about 5 kQ at 5V. In some examples, the switch impedance may significantly affect the performance of the DigiPot 102, especially wherein the switch impedance constitutes a significant fraction of the overall impedance of the DigiPot 102, for example where the switch impedance is significant relative to the total string impedance of the resistor ladder 120.

Because the switch impedance varies exponentially as a function of voltage, variations in Vdd applied to the pin switches 310, 312, and 314 and/or DigiPot 102 over time (e.g., depending on the current status of the microcontroller 302) may significantly reduce the predictability and reliability of the output of the DigiPot 102.

Thus, the example microcontroller 302 includes a charge pump 340 to apply a constant charge pump voltage Vdd_hvp to the pin switches 310, 312, and 314 and the DigiPot 102 (in particular, potentiometer switches 124), e.g., independent of Vdd and changes in Vdd over time. As shown in FIG. 3, the charge pump 340 may supply the charge pump voltage Vdd_hvp to (a) respective level shifters 320, 322, and 324 proved at the respective pin switches 310, 312, and 314 pins to maintain the pin switches 310, 312, and 314 at the charge pump voltage Vdd_hvp, and thereby maintain a constant switch impedance of respective pin switches 310, 312, and 314, and (b) to the DigiPot 102 to maintain the potentiometer switches 124 at the charge pump voltage Vdd_hvp, and thereby maintain a constant switch impedance of respective potentiometer switches 124.

In some examples, the microcontroller 302 may selectively enable/disable the charge pump 340 using a CP_enable signal 342 generated by a charge pump select setting 364 stored in memory 104. In addition, the microcontroller 302 may selectively switch between the digital supply voltage (Vdd) or the charge pump voltage (Vdd_hvp) to be applied at the pin switches 310, 312, and 314, for example depending on whether the DigiPot 102 is currently enabled. In the example shown in FIG. 3, the microcontroller 302 includes switching circuitry 346 to select between the digital supply voltage (Vdd) and charge pump voltage (Vdd_hvp), which selection may be controlled by the processor 106 using a Vdd_hvp_select signal 350. In some examples, the switching circuitry 346 comprises a multiplexer (MUX).

The disclosed microcontrollers (e.g., embedded microcontrollers) including an integrated DigiPot may provide various advantages over conventional microcontroller connected to a stand-alone DigiPot. For example, various components and pins of the stand-alone DigiPot may be eliminated, as the respective circuitry may be provided internal to the microcontroller. For example, the non-volatile memory (NVM) of a stand-alone DigiPot may be eliminated. As another example, the serial interface of a stand-alone DigiPot may be eliminated, as the DigiPot may be programmed by the microcontroller processor (e.g., CPU). As another example, the packaging of the stand-alone DigiPot may be eliminated. Based on the above, costs may be significantly reduced as compared with conventional designs.

The example microcontrollers 100 and 302 shown in FIGS. 1-3 may be implemented as potentiometers, rheostats, or grounded resistors. For example, microcontroller 100 or 302 may be implemented as a potentiometer, wherein all three pins 110, 112, and 114 are connected to corresponding DigiPot terminals 130, 132, and 134, respectively. As another example, microcontroller 100 or 302 may be implemented as a rheostat may, wherein pins 110 and 112 are connected to corresponding DigiPot terminals 130, 132, respectively, but wherein the second terminal 134 is allowed to float. As another example, microcontroller 100 or 302 may be implemented as a grounded resistor, wherein the second pin 112 is connected to the wiper terminal 132, wherein the first terminal 130 is allowed to float, and wherein the second terminal 134 is tied to ground.

Although example embodiments have been described above, other variations and embodiments may be made from this disclosure without departing from the spirit and scope of these embodiments.

The invention claimed is:

1. An apparatus, comprising:
a microcontroller, comprising:
   a microcontroller packaging;
   a digital potentiometer provided in the microcontroller packaging and including:
      a resistor ladder including a plurality of resistors arranged in series and a plurality of potentiometer switches;
      a first resistor terminal connected to the resistor ladder;
      a wiper terminal connected to the resistor ladder;
      wherein the plurality of potentiometer switches are selectively controllable to selectively connect at least a subset of the plurality of resistors between the first resistor terminal and the wiper terminal to define a resistance between the first resistor terminal and the wiper terminal;
   a microcontroller memory arranged in the microcontroller packaging, the microcontroller memory storing a wiper select signal;
   a processor arranged in the microcontroller packaging, the processor to transmit the wiper select signal to the digital potentiometer to selectively control the plurality of switches to control the resistance between the first resistor terminal and the wiper terminal;
   a first pin connected or connectable to the first resistor terminal; and
   a second pin connected or connectable to the wiper terminal;
   wherein the first pin and the second pin are exposed through the microcontroller packaging to allow connection of the digital potentiometer to an electronic device external to the microcontroller.

2. The apparatus of claim 1, wherein the microcontroller comprises a charge pump to apply a charge pump voltage to the potentiometer switches.

3. The apparatus of claim 2, wherein the microcontroller comprises switching circuitry to selectively switch between:
(a) a first switch state in which the supply voltage is applied to the potentiometer switches and
(b) a second switch state in which the charge pump voltage is applied to the potentiometer switches to maintain a constant impedance of the potentiometer switches, independent of variations in the supply voltage.

4. The apparatus of claim 1, wherein the microcontroller comprises:
   a first pin switch connected between the first pin and the first resistor terminal; and
   a second pin switch connected between the second pin and the wiper terminal; and
   wherein the first pin switch and the second pin switch are controllable by the processor using respective pin switch control signals.

5. The apparatus of claim 4, wherein:
the first pin switch is controllable to selectively connect the first pin to different selected circuitry, including at least (a) the first resistor terminal of the digital potentiometer and (b) a first other circuit component of the microcontroller; and
the second pin switch is controllable to selectively connect the first pin to different selected circuitry, including at least (a) the second resistor terminal of the digital potentiometer and (b) a second other circuit component of the microcontroller.

6. The apparatus of claim 4, wherein the microcontroller comprises a charge pump to apply a constant charge pump voltage to the first pin switch and the second pin switch.

7. The apparatus of claim 4, wherein the microcontroller comprises switching circuitry to selectively switch, based on a charge pump select signal, between (a) a first switch state in which the supply voltage is applied to the first pin switch and the second pin switch and (b) a second switch state in which the constant charge pump voltage is applied to the first pin switch and the second pin switch.

8. The apparatus of claim 1, wherein the digital potentiometer comprises a potentiometer.

9. The apparatus of claim 1, wherein the digital potentiometer comprises a rheostat.

10. The apparatus of claim 1, wherein:
the digital potentiometer comprises a second resistor terminal connected to the resistor ladder, wherein the plurality of potentiometer of resistors are connected between the first resistor terminal and the second resistor terminal; and
the microcontroller comprises a third pin connected to the second resistor terminal, wherein the third pin is exposed through the microcontroller packaging.

11. The apparatus of claim 10, comprising:
a first pin switch connected between the first pin and the first resistor terminal;
a second pin switch connected between the second pin and the wiper terminal; and
a third pin switch connected between the third pin and the second resistor terminal;
wherein the first pin switch, the second pin switch, and the third pin switch are controllable by the processor using respective pin switch control signals.

12. An apparatus, comprising:
an electronic device including electronic device circuitry; and
a microcontroller connected to the electronic device, the microcontroller comprising:
a microcontroller packaging;
a digital potentiometer arranged in the microcontroller packaging and including:
a resistor ladder including a plurality of resistors arranged in series, and a plurality of selectively controllable potentiometer switches;
a first resistor terminal connected to the resistor ladder;
a wiper terminal connected to the resistor ladder;
a first pin connected to the first resistor terminal; and
a second pin connected to the wiper terminal;
wherein the first pin and the second pin are exposed through the microcontroller packaging and connectable to the electronic device;
a microcontroller memory arranged in the microcontroller packaging, the microcontroller memory storing a wiper select signal; and
a processor arranged in the microcontroller packaging, the processor to transmit the wiper select signal to the digital potentiometer to selectively control the plurality of potentiometer switches to control the resistance between the first resistor terminal and the wiper terminal, and thereby selectively control a resistance through the electronic device circuitry of the electronic device.

13. The apparatus of claim 12, wherein the microcontroller comprises a charge pump to apply a charge pump voltage to the potentiometer switches.

14. The apparatus of claim 12, wherein the microcontroller comprises switching circuitry to selectively switch, based on a charge pump select signal, between:
(a) a first switch state in which the supply voltage is applied to the potentiometer switches and
(b) a second switch state in which the charge pump voltage is applied to the potentiometer switches to maintain a constant impedance of the potentiometer switches, independent of variations in the supply voltage.

15. The apparatus of claim 12, wherein the microcontroller comprises:
a first pin switch connected between the first pin and the first resistor terminal; and
a second pin switch connected between the second pin and the wiper terminal; and
wherein the first pin switch and the second pin switch are controllable by the processor using respective pin switch control signals.

16. The apparatus of claim 15, wherein:
the first pin switch is controllable to selectively connect the first pin to either (a) the first resistor terminal of the digital potentiometer or (b) a first other circuit component of the microcontroller; and
the second pin switch is controllable to selectively connect the second pin to either (a) the second resistor terminal of the digital potentiometer or (b) a second other circuit component of the microcontroller.

17. The apparatus of claim 15, wherein the microcontroller comprises a charge pump to apply a constant charge pump voltage to the first pin switch and the second pin switch.

18. The apparatus of claim 17, wherein the microcontroller comprises switching circuitry to selectively switch, based on a charge pump select signal, between (a) a first switch state in which the supply voltage is applied to the first pin switch and the second pin switch and (b) a second switch state in which the constant charge pump voltage is applied to the first pin switch and the second pin switch.

19. An apparatus, comprising:
a microcontroller, comprising:
a microcontroller packaging;
a digital potentiometer provided in the microcontroller packaging and including:
a resistor ladder including a plurality of resistors arranged in series and a plurality of potentiometer switches;
a first resistor terminal connected to the resistor ladder;
a wiper terminal connected to the resistor ladder;
wherein the plurality of potentiometer switches are selectively controllable to selectively connect at least a subset of the plurality of resistors between the first resistor terminal and the wiper terminal to define a resistance between the first resistor terminal and the wiper terminal; and
a charge pump to apply a charge pump voltage to respective potentiometer switches of the plurality of potentiometer switches.

20. The apparatus of claim 19, the microcontroller comprises switching circuitry to selectively switch between (a) a first switch state in which the supply voltage is applied to the potentiometer switches and (b) a second switch state in which the charge pump voltage is applied to the potentiometer switches.

* * * * *